(12) United States Patent
Toyoda et al.

(10) Patent No.: US 10,163,607 B2
(45) Date of Patent: Dec. 25, 2018

(54) TEMPERATURE CONTROL METHOD AND PLASMA PROCESSING APPARATUS

(71) Applicant: Tokyo Electron Limited, Tokyo (JP)

(72) Inventors: Keigo Toyoda, Miyagi (JP); Hiroshi Tsujimoto, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 332 days.

(21) Appl. No.: 15/175,229

(22) Filed: Jun. 7, 2016

(65) Prior Publication Data

US 2016/0365229 A1 Dec. 15, 2016

(30) Foreign Application Priority Data

Jun. 11, 2015 (JP) ................................. 2015-118072

(51) Int. Cl.
*H01J 37/32* (2006.01)

(52) U.S. Cl.
CPC .. *H01J 37/32522* (2013.01); *H01J 37/32009* (2013.01); *H01J 37/3244* (2013.01); *H01J 37/32724* (2013.01); *H01J 37/32935* (2013.01); *G05B 2219/45212* (2013.01); *H01J 2237/334* (2013.01)

(58) Field of Classification Search
USPC ........................................ 700/121, 207–211
See application file for complete search history.

(56) References Cited

U.S. PATENT DOCUMENTS

| 6,629,423 | B1 | 10/2003 | Hirooka et al. | |
|---|---|---|---|---|
| 2011/0220288 | A1 | 9/2011 | Kobayashi et al. | |
| 2015/0132863 | A1* | 5/2015 | Oohashi | H01J 37/32082 438/5 |
| 2015/0143146 | A1 | 5/2015 | Eto et al. | |

FOREIGN PATENT DOCUMENTS

| CN | 102903651 | 1/2013 |
|---|---|---|
| JP | 2008-177285 | 7/2008 |

* cited by examiner

*Primary Examiner* — Robert E Fennema
*Assistant Examiner* — Marzia T Monty
(74) *Attorney, Agent, or Firm* — IPUSA, PLLC

(57) ABSTRACT

A method for controlling the temperature of a mounting table in a plasma processing apparatus, includes: calculating a first heat input amount according to high frequency power applied in a given process, wherein the first heat input amount is calculated based on a data table, the data table being generated by measuring temperatures so as to find a first relationship between the high frequency power applied in the plasma processing apparatus and the heat input amount to the mounting table; controlling, based on an operation map, the temperature of at least one of the first heating mechanism and the cooling mechanism so that a first temperature difference between the cooling mechanism and the first heating mechanism is within a controllable range corresponding to the first heat input amount, wherein the temperature of the first heating mechanism is controllable upon the first temperature difference falling within the controllable.

8 Claims, 9 Drawing Sheets

TEMPERATURE CONTROL METHOD AND PLASMA PROCESSING APPARATUS

CROSS-REFERENCE TO RELATED APPLICATION

The present application is based upon and claims the benefit of priority of Japanese patent application No. 2015-118072, filed on Jun. 11, 2015, the entire contents of which are incorporated by reference in their entirety.

BACKGROUND OF THE PRESENT INVENTION

1. Field of the Present Invention

The present disclosure relates to temperature control methods and plasma processing apparatuses.

2. Description of the Related Art

As for a plasma processing apparatus including an etching apparatus, temperature control of a substrate for obtaining good plasma characteristics, including the etching, rate is important. Therefore, a method is proposed, in which temperature distribution on the surface of a mounting table for mounting the substrate is controlled by a heater in the mounting table, etc., so as to control the temperature of the substrate (e.g. Patent Document 1).

However, when high frequency power is applied, the output value of the heater may become "0" because output power of the heater decreases due to unsettled heat input from plasma generated in the plasma processing apparatus. When the output value of the heater becomes 0, the heater cannot be controlled. Therefore, for example, the temperature of the mounting table increases as the high frequency power increases. Temperature control of the substrate is difficult in such a situation.

[Patent Document 1]: Japanese Laid-open Patent Publication No. 2008-177285

SUMMARY OF THE PRESENT DISCLOSURE

An object of one aspect of the present disclosure is to improve controllability of the temperature of the mounting table in the plasma processing apparatus.

According to an embodiment of the invention, there is provided a temperature control method for controlling the temperature of a mounting table in a plasma processing apparatus for mounting a substrate thereon, wherein a temperature adjusting mechanism is disposed in the plasma processing apparatus, the temperature adjusting mechanism including a cooling mechanism for cooling the mounting table and a first heating mechanism for heating the mounting table, the temperature control method comprising: calculating a first heat input amount according to high frequency power applied in a given process, wherein the first heat input amount is calculated based on a data table stored in a storage unit in advance, the data table being generated by measuring temperatures so as to find a first relationship between the high frequency power applied in the plasma processing apparatus and the heat input amount to the mounting table; controlling, based on an operation map stored in the storage unit, the temperature of at least one of the first heating mechanism and the cooling mechanism so that a first temperature difference between the cooling mechanism and the first heating mechanism is within a controllable range corresponding to the first heat input amount, wherein the temperature of the first heating mechanism is controllable upon the first temperature difference falling within the controllable range, and the operation map defines a series of successive control ranges associated with respective different first heat input amounts.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF PREFERRED EMBODIMENTS

Figure 1:
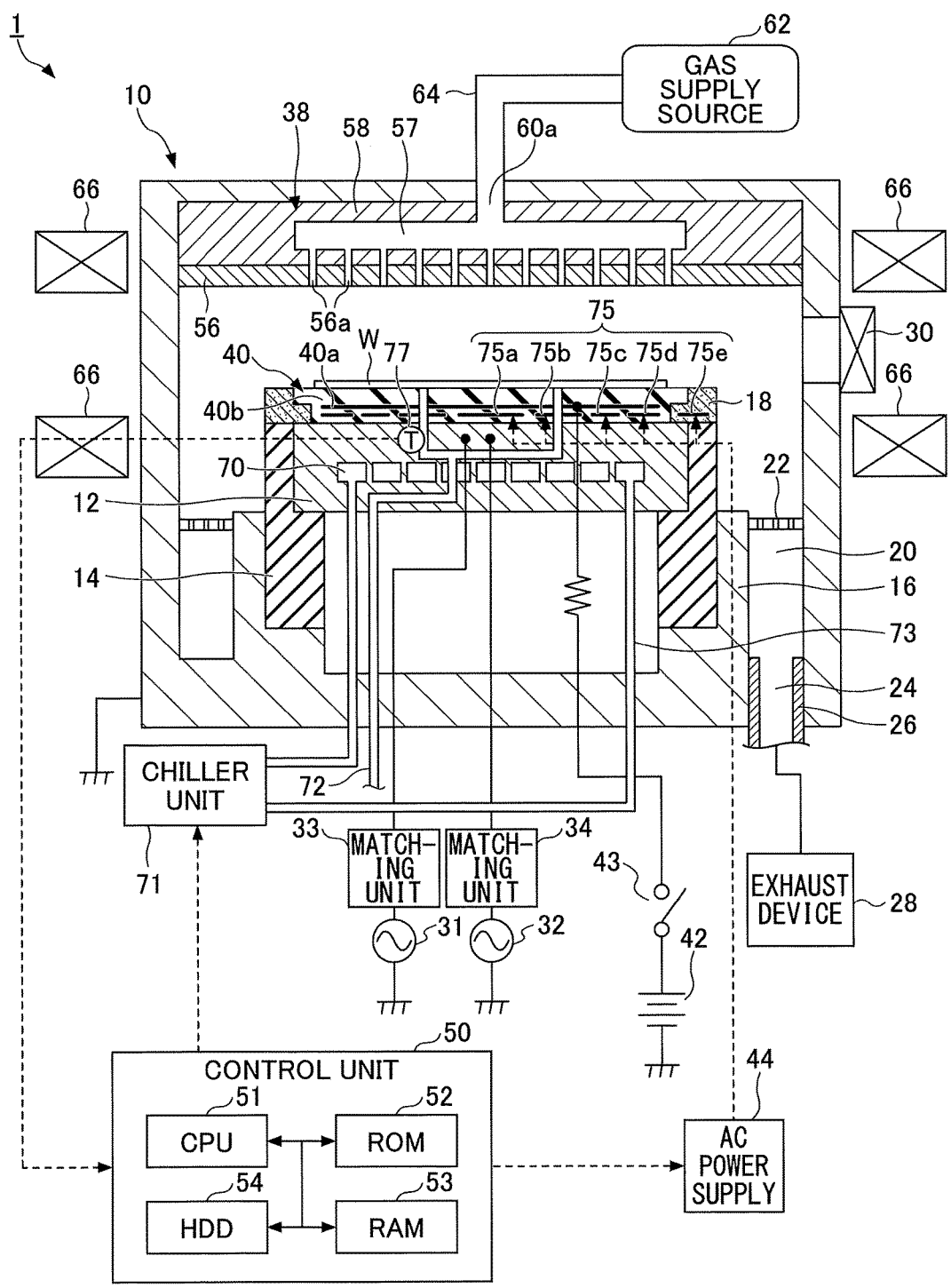
FIG. 1 is a diagram depicting a cross sectional view of a plasma processing apparatus of an embodiment of the invention.

Herein below, embodiments of the invention will be described with reference to the accompanying drawings. Additionally, in the present specification and drawings, identical reference numerals will be applied to elements or the like that have substantially similar functions and configurations to those in another embodiment, and descriptions thereof may be omitted.

<Example Configuration of Plasma Processing Apparatus>

First, an example configuration of a plasma processing apparatus of an embodiment will be described with reference to FIG. 1. As shown in FIG. 1, a capacitively coupled plasma etching apparatus is exemplified as the plasma processing apparatus 1 in the present embodiment.

For example, the plasma processing apparatus 1 includes a cylindrical chamber 10 made of aluminum having an alumite-treated (anodized) surface. The chamber 10 is grounded.

Amounting table 12 is disposed in the chamber 10. The mounting table 12 may be made of aluminum Al, titanium Ti, silicon carbide SiC, etc, for example, and is supported on a support 16 via an insulating holder 14. Thus, the mounting table 12 is disposed on the bottom of the chamber 10.

An exhaust line 26 is provided at the bottom of the chamber 10 and is connected to an exhaust device 28. The exhaust device 28 includes a vacuum pump, such as a turbo-molecular pump, or a drive pump. The exhaust device 28 is configured to depressurize a processing space within the chamber 10 to a predetermined vacuum level and to control gas-flow in the chamber 10 to guide the gas-flow to an exhaust path 20 and an exhaust port 24. A baffle plate 22 for controlling the gas-flow is disposed in the exhaust path 20.

A first high frequency power supply 31 for exciting plasma and a second high frequency power supply 32 for drawing ions to wafer W are respectively connected to the mounting table 12 via a matching unit 33 and via a matching unit 34. For example, the first high frequency power supply 31 applies a high frequency power HF (high frequency power for exiting plasma) to the mounting table 12, where the high frequency power HF has a frequency such as 60 MHz for generating plasma within the chamber 10. The second high frequency power supply 32 applies a high frequency power LF (high frequency power for drawing ions) to the mounting table 12, where the high frequency power LF has a relatively low frequency such as 13.56 MHz for drawing ions to the wafer W disposed on the mounting table 12. In this way, the mounting table 12 holds the wafer W while also serving as a lower electrode.

An electrostatic chuck 40 configured to hold the wafer W by an electrostatic attractive force is provided on the top surface of the mounting table 12. The electrostatic chuck 40 includes an electrode 40a that is made of a conductive film and is arranged between a pair of insulating layers 40b (or a pair of insulating films), and a DC voltage supply 42 is electrically connected to the electrode 40a via a switch 43. The electrostatic chuck 40 electrostatically attracts and holds the wafer W by a Coulomb force that is generated when a voltage is applied thereto from the DC voltage supply 42. A temperature sensor 77 is provided for the electrostatic chuck 40 to measure a temperature of the electrostatic chuck 40. Thus, the temperature of the wafer W on the electrostatic chuck 40 is measured.

A focus ring 18 is arranged on an outer edge of the electrostatic chuck 40, where the focus ring 18 surrounds the outer edge of the mounting table 12. For example, the focus ring 18 is made of silicon or quartz. The focus ring 18 improves in-plane etching uniformity.

A gas shower head 38 that serves as an upper electrode at a ground potential is provided at a ceiling portion of the chamber 10. Thus, the high frequency power from the first high frequency power supply 31 is capacitively applied between the mounting table 12 and the gas shower head 38.

The gas shower head 38 includes an electrode plate 56 having multiple gas holes 56a and an electrode supporting body 58 configured to detachably hold the electrode plate 56. A gas supply source 62 supplies gas to the gas shower head 38 via a gas supply pipe 64, which is connected to a gas inlet 60a. The gas is diffused in a gas diffusion space 57 and introduced into inside of the chamber 10 from the multiple gas holes 56a. A magnet 66 is arranged to extend annularly or concentrically around the chamber 10 so as to control of plasma generation within a plasma generation space of the chamber 10 between the upper electrode and a lower electrode by means of the magnetic force of the magnet 66.

A plurality of heaters 75a, 75b, 75c, 75d and 75e (hereinafter also referred to heaters 75) are integrated in the electrostatic chuck 40. Also, the heaters 75 may be attached to a backside surface of the electrostatic chuck 40 instead of being integrated in the electrostatic chuck 40. An AC voltage is applied to the heaters 75a, 75b, 75c, 75d and 75e from an AC power supply 44 via a power supply line 47.

Thus, the heater 75a heats a center portion of the mounting table 12. The heater 75b heats a middle portion of the mounting table 12. The heater 75c heats an edge portion of the mounting table 12. The heater 75d heats a very edge portion of the mounting table 12. The heater 75e heats the focus ring 18. In a case where the surface of the mounting table 12 is divided into a circular zone (center portion C) and three annular zones (middle portion M, edge portion E and very edge portion VE) from center to outer edge, the respective heaters 75a, 75b, 75c and 75d enables heating on a zone-by-zone basis. Additionally, the heaters 75a, 75b, 75c and 75d are examples of a first heating mechanism for heating the respective zones of the surface of the mounting table 12 on a zone-by-zone basis. Also, the heater 75e is an example of a second heating mechanism for heating the focus ring. In the present embodiment, although the surface of the mounting table 12 divided into four zones is heated, the entire surface may be a single zone or be divided into two or more zones. Number of heaters 75 may be determined in accordance with number of zones and presence/absence of the focus ring 18. Also, shapes of the respective zones may be other than circular and annular.

A coolant path 70 is formed within the mounting table 12. A coolant (hereinafter also referred to as "Brine") is supplied to the coolant path 70 from a chiller unit 71 via a coolant pipe 70 and a coolant circulation pipe 73, thereby cooling the mounting table 12. A mechanism for supplying the brine to the coolant pipe 70 is an example of cooling mechanism for cooling the mounting table 12.

According to the aforementioned configuration, the respective zones of mounting table 12 in which the heaters 75a, 75b, 75c, 75d and 75e are integrated are independently heated on a zone-by-zone basis, and cooled by the brine at a certain temperature flowing in the coolant pope 70. Thus, the temperature of the wafer W is adjusted to be a desired temperature. Also, heat transfer gas such as helium (He) is supplied between the top surface of the electrostatic chuck 40 and the backside surface of the wafer W through a heat transfer gas supply line 72.

A control unit 50 includes a CPU 51, a ROM (Read Only Memory) 52, a RAM (Random Access Memory) 53 and a HDD (Hard Disk Drive) 54. The CPU 51 performs plasma processing including etching in accordance with a process set in a recipe stored in a storage unit in the ROM 52, RAM 53 or HDD 54. Also, data including data table (described below) is stored in the storage unit. The control unit 50 controls the temperature of the heating mechanism using the heaters 75 and the cooling mechanism using the brine.

When the plasma processing, such as etching, is performed in the plasma processing apparatus 1 having the aforementioned configuration, first, the wafer W is loaded into the chamber 10 from the gate valve 30. The wafer W is placed on the electrostatic chuck 40. After the wafer W is loaded, the gate valve 30 is closed. The internal pressure of the chamber 10 is reduced to a predetermined pressure by the exhaust device 28. A voltage from the DC voltage supply 42 is applied to the electrode 40a of the electrostatic chuck 40 so that the wafer W is fixed to the electrostatic chuck 40.

A certain type of gas is sprayed into the chamber 10 from the gas shower head 38, and the high frequency power HF to excite the gas into plasma is applied to the mounting table 12. When the introduced gas is ionized and dissociated by the high frequency power HF, the plasma is generated and the plasma processing such as the etching is performed on the wafer W due to the plasma. The high frequency power LF for drawing ions may be applied to the mounting table 12. After finishing the plasma processing, the wafer W is carried outside the chamber 10.

<Example Graph Indicating Relationship Between High Frequency Power and Heat Input Amount>

Figure 2:
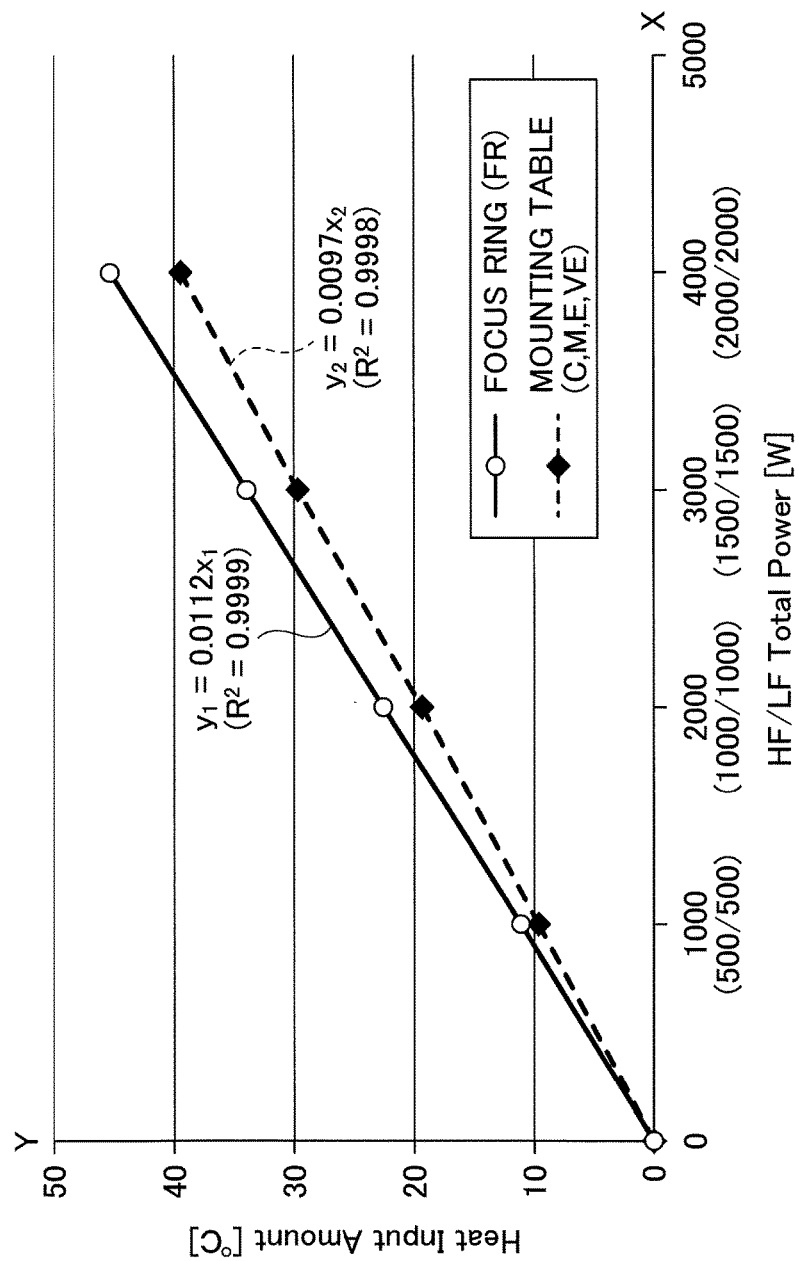
FIG. 2 is an example graph indicating the relationship between high frequency power and a heat input amount.

In the following, example formula indicating a relationship between the high frequency power and a heat input amount for performing the temperature control of the present embodiment will be described with reference to FIG. 2. FIG. 2 is an example graph indicating the relationship between the high frequency power and the heat input amount expressed by the formula. In the following, a creation process of the graph indicating the relationship between the high frequency power and the heat input amount will be described.

First, a temperature of the electrostatic chuck 40 when the high frequency power HF for exciting plasma and the high frequency power LF for drawing ions are applied to the mounting table 12 is measured by the temperature sensor 77. The measured temperature is transmitted to the control unit 50. The heat input amounts from the plasma associated with the measured temperatures are plotted as the high frequency power HF for exciting plasma and the high frequency power LF for drawing ions increase, thereby creating the graph indicating the relationship between the high frequency power and the heat input amount.

In the example shown in FIG. 2, a total electric power "x" of the high frequency power HF for exciting plasma and the high frequency power LF for drawing ions is indicated by a horizontal axis while the heat input amount "y" associated with the measured temperature is indicated by the vertical axis. Thus, the heat input amount with respect to the high frequency power can be quantified. A formula "$y_2=0.0097x_2$" shown in FIG. 2 indicates the heat input amount $y_2$ with respect to the high frequency power $x_2$ at the center portion C, the middle portion M, the edge portion E, and the very edge portion VE of the mounting table 12. A formula "$y_1=0.0112x_1$" shown in FIG. 2 indicates the heat input amount $y_1$ with respect to the high frequency power $x_1$ at the focus ring 18.

"$R^2$" shown in FIG. 2 indicates a reliability of respective formulas "$y_1=0.0112x_1$" and "$y_2=0.0097x_2$", where the lines $y_1$ and $y_2$ are calculated using least-square method based on the respective plotted values. The reliabilities of formulas increase as the value of "$R^2$" becomes closes to 1. Thus, the reliabilities of formulas shown in FIG. 2 are high.

Additionally, the formulas indicating the relationship between the high frequency power and the heat input amount show in FIG. 2 are example results of an etching with a certain process. In the etching, the internal pressure of the plasma processing apparatus 1 is controlled to be 40 mT (5.33 Pa), while carbon tetrafluoride ($CF_4$) gas and argon (Ar) gas are supplied into the plasma processing apparatus 1 and the respective high frequency powers HF and LF are applied. The formulas shown in FIG. 2 are calculated based on the measured values of the temperature sensor 77 when the etching is performed under such a process condition. As described above, the formula shown in FIG. 2 only indicates the relationship between the high frequency power and the heat input amount under a given process condition.

Therefore, other formulas indicating the relationship between the high frequency power and the heat input amount can be also calculated based on the measured values of the temperature sensor 77 when the plasma processing apparatus 1 performs an etching process under another process condition.

Also, formulas indicating the relationship between the high frequency power and the heat input amount vary depending on a type of gas, a pressure, a gas-flow rate, and the like. For example, the heat input amount from the plasma is determined in accordance with an electron density of the plasma, the ion density of the plasma and values of high frequency power LF for drawing ions and the high frequency power HF for exciting plasma. For example, when a different type of gas is used, a size of ion varies to change the heat input amount from the plasma. That is, the type of gas is another factor that changes the heat input amount from the plasma. Similarly, the pressure is a factor to change the heat input amount from the plasma. Further, in a case where hot gas is supplied form gas shower head 38, the hot gas brings heat input amount other than that from the plasma.

Therefore, according to measured values under respective process conditions, formulas indicating the relationship between the high frequency powers HF and LF and the heat input amount are calculated on a process-by-process basis, and data tables generated through the calculation are stored in the storage unit in advance. Also, a formula indicating a relationship between a flow rate of the hot gas and the heat input amount may be calculated based on measured values to store the data table generated through the calculation in the storage unit.

The formulas shown in FIG. 2 indicate the relationship between the total electric power of the high frequency power HF for exciting plasma and the high frequency power LF for drawing ions and the heat input amount. However, a formula indicating a relationship between the high frequency power HF for exciting plasma and the heat input amount may be calculated. Also, a formula indicating a relationship between the high frequency power LF for drawing ions and the heat input amount may be calculated. Additionally, in the present embodiment, although the high frequency power HF for exciting plasma is applied to the mounting table 12, the high frequency power HF for exciting plasma may be applied to the gas shower head 38.

As described above, the data table of the formula indicating the relationship between the high frequency power and the heat input amount are gathered and stored in the storage unit of RAM 53, HDD 54, etc., to be managed before the temperature control method of the present embodiment is performed. The formula "$y_2=0.0097x_2$" (relational expression $y_2$) to be recorded in the data table is an example of first relationship information indicating the relationship between the high frequency power applied to the plasma processing apparatus 1 and the heat input amount to the mounting table 12. The formula "$y_1=0.0112x_1$" (relational expression $y_1$) is an example of second relationship information indicating the relationship between the high frequency power applied to the plasma processing apparatus 1 and the heat input amount to the focus ring 18.

The control unit 50 selects an relational expression suitable for a process condition under which next plasma processing is performed from relational expressions stored in the storage unit to use it for temperature control of the mounting table 12.

In an actual plasma processing, in a case where the high frequency power HF and the high frequency power LF are applied, temperature difference between the heaters 75 and the brine is decreased by the heat input amount calculated by the relational expressions $y_1$ and $y_2$. The output values of the heaters 75 are determined in accordance with the temperature difference between the heaters 75 and the brine. That is, the output value of the heaters 75 decreases as the temperature difference between the heaters 75 and the brine decreases. When the output value of the heaters 75 becomes 0, the heaters 75 cannot be controlled, which makes it difficult to control the temperature of the wafer W. Hence, the output value of the heaters 75 needs to be greater than 0 in order to prevent making the temperature control of the wafer W be difficult. Therefore, in the temperature control of the present embodiment, the output values of the heaters 75 are changed according to the decrease of the temperature difference between the heaters 75 and the brine upon applying the high frequency powers HF and LF, thereby securing the temperature difference between the brine and the heaters 75. Thus, a situation where the heater cannot be controlled, due to the output value 0 of the heaters 75 can be prevented. In the following, the temperature control is performed with the temperature of the brine being less than the temperature of the heaters 75.

<Example Temperature Control of Mounting Table>

In the temperature control method of the present embodiment, the output values of the heaters 75 are changed in order to secure the temperature difference between the brine and the heaters 75. An example temperature control process of the present embodiment will be described with reference to FIG. 3.

Figure 3:
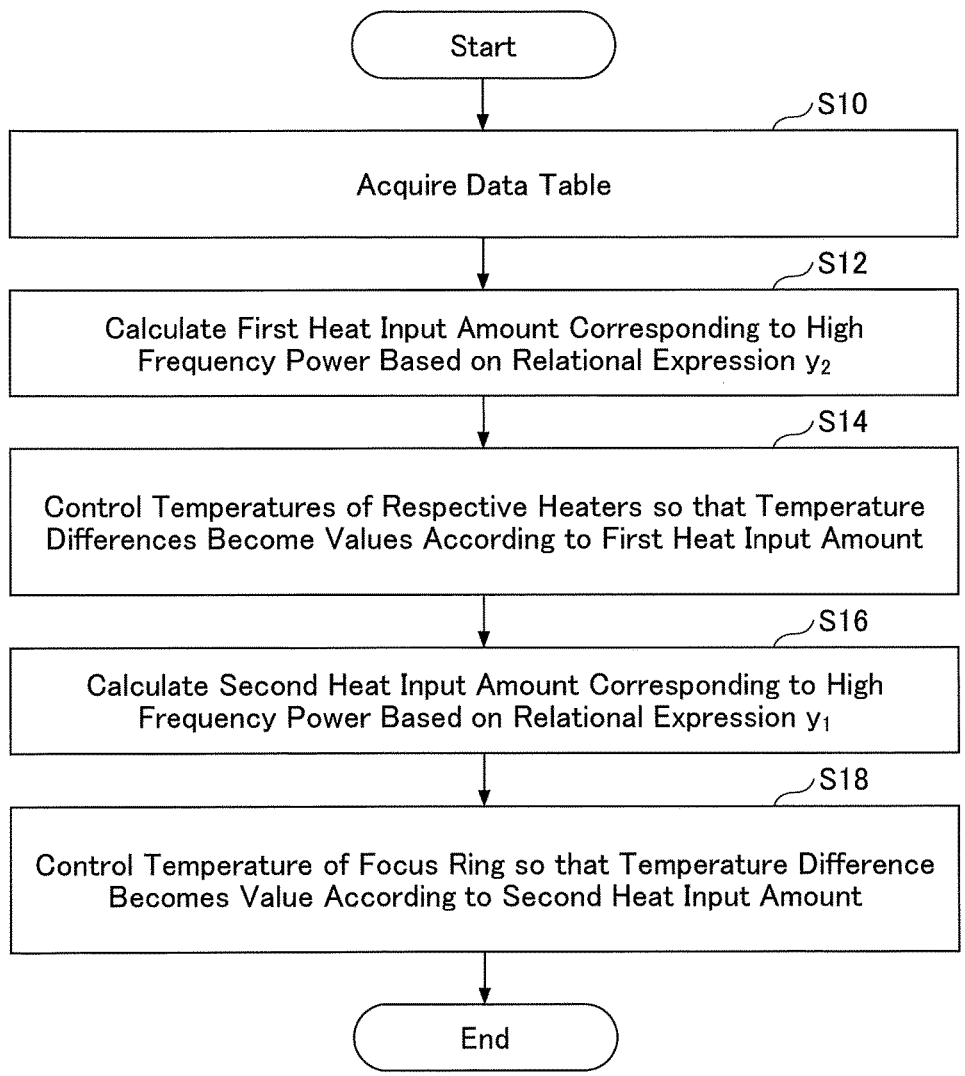
FIG. 3 is a flowchart illustrating an example temperature control process.

Upon the process shown in FIG. 3 being started, the control unit 50 acquires the data table in which the relational expressions (relational information) indicating the relationship between the high frequency power and the heat input amount are recorded (step S10). In a case where a plurality of data tables are recorded in the storage unit, the control unit 50 selects the data table suitable for the process condition under which next plasma processing is performed. For example, the data table shown in FIG. 2 is selected.

Then, the control unit 50 calculates a first heat input amount corresponding to the total power of the high frequency powers HF and LF respectively set in the process recipe based on the formula "$y_2=0.0112x_2$" shown in FIG. 2 (step S12). For example, in a case where the total power of the high frequency powers HF and LF is 2000 W, the first heat input amount is calculated to be 20° C.

Referring back to FIG. 3, the control unit 50 controls temperatures of respective heaters 75 so that the temperature differences between the brine and the heaters 75a, 75b, 75c and 75d at the center portion, the middle portion, the edge portion and the very edge portion become values according to the first heat input amount (step S14).

Figure 4:
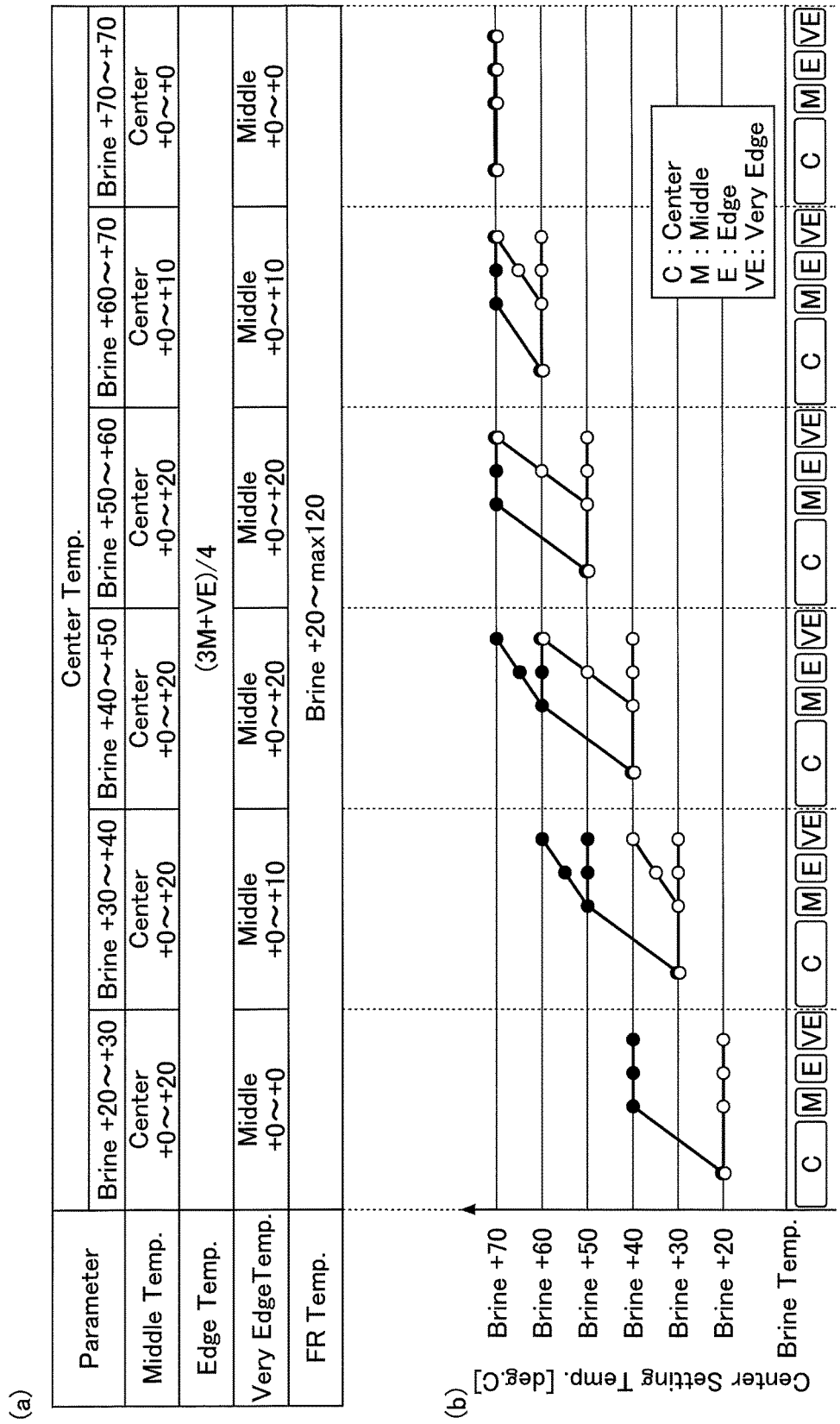
FIG. 4 is a diagram illustrating an example temperature control according to the heat input amount.

For example, FIG. 4 shows an example operation map for temperature control of the center portion C, the middle portion M, the edge portion E, the very edge portion VE and the focus ring with respect to the brine in a case where both of the high frequency powers HF and LF are not applied. Portion (b) in FIG. 4 illustrates an example operation map indicating a temperature control range of the heaters 75 integrated in the center portion C, the middle portion M, the edge portion E and the very edge portion VE according to the temperature difference between the brine and the heater 75 shown in portion (a) of FIG. 4.

In a case where neither of the high frequency power HF and LF is applied, the heat input amount from the plasma is 0. In this case, as shown in portion (a) of FIG. 4, respective temperatures of the center portion C, the middle portion M, the edge portion E and the very edge portion VE in the surface of the mounting table 12 are controlled based on the temperature difference between the center portion and the brine measured by the temperature sensor 77 as follows.

<Temperature Control of Middle Portion>

(1) in a case where the temperature of center portion (C) is greater than the temperature of the brine by 20° C.-30° C.

The temperature of the middle portion (M: Middle Temp.) is controlled to be greater than the temperature of the center portion (C: Center Temp.) by 0° C.-20° C.

(2) in a case where the temperature of center portion (C) is greater than the temperature of the brine by 30° C.-40° C.

The temperature of the middle portion (M) is controlled to be greater than the temperature of the center portion (C) by 0° C.-20° C.

(3) in a case where the temperature of center portion (C) is greater than the temperature of the brine by 40° C.-50° C.

The temperature of the middle portion (M) is controlled to be greater than the temperature of the center portion (C) by 0° C.-20° C.

(4) in a case where the temperature of center portion (C) is greater than the temperature of the brine by 50° C.-60° C.

The temperature of the middle portion (M) is controlled to be greater than the temperature of the center portion (C) by 0° C.-20° C.

(6) in a case where the temperature of center portion (C) is greater than the temperature of the brine by 60° C.-70° C.

The temperature of the middle portion (M) is controlled to be greater than the temperature of the center portion (C) by 0° C.-10° C.

(7) in a case where the temperature of center portion (C) is greater than the temperature of the brine by 70° C.

The temperature of the middle portion (M) is controlled to be the same as the temperature of the center portion (C).

<Temperature Control of Edge Portion (Edge Temp.)>

In respective cases of above described (1)-(7), the temperature of the edge portion (E) is controlled in accordance with formula described below.

$$(3 \times \text{"middle portion temperature}(M)\text{"} + \text{"very edge portion temperature}(VE)\text{"})/4$$

<Temperature Control of Very Edge Portion>

(1) in a case where the temperature of center portion (C) is greater than the temperature of the brine by 20° C.-30° C.

The temperature of the very edge portion (VE: Very Edge Temp.) is controlled to be the same as the temperature of middle portion (M).

(2) in a case where the temperature of center portion (C) is greater than the temperature of the brine by 30° C.-40° C.

The temperature of the very edge portion (VE) is controlled to be greater than the temperature of middle portion (M) by 0° C.-10° C.

(3) in a case where the temperature of center portion (C) is greater than the temperature of the brine by 40° C.-50° C.

The temperature of the very edge portion (VE) is controlled to be greater than the temperature of middle portion (M) by 0° C.-20° C.

(4) in a case where the temperature of center portion (C) is greater than the temperature of the brine by 50° C.-60° C.

The temperature of the very edge portion (VE) is controlled to be greater than the temperature of middle portion (M) by 0° C.-20° C.

(6) in a case where the temperature of center portion (C) is greater than the temperature of the brine by 60° C.-70° C.

The temperature of the very edge portion (VE) is controlled to be greater than the temperature of middle portion (M) by 0° C.-10° C.

(7) in a case where the temperature of center portion (C) is greater than the temperature of the brine by 70° C.

The temperature of the very edge portion (VE) is controlled to be the same as the temperature of middle portion (M).

<Temperature Control of Focus Ring (Focus Ring Temp.)>

The temperature is controlled to be greater than the temperature of brine by at least 20° C. and at most by 120° C. The control unit 50 controls the temperature differences between the temperatures of the heaters 75a-75d at the center portion-very edge portion and the brine to be equal to or less than 70° C.

Also, the control unit 50 controls the temperature difference between the heater 75a at the center portion and the heater 75d at the very edge portion to be equal to or less than 30° C.

Thus, as shown as the operation map in portion (b) of FIG. 4, temperature control of respective portions of the middle portion M, the edge portion E, the very edge portion VE are performed setting a range of temperature with respect to the temperature of the center portion C, in which the minimum temperature corresponds to the minimum value among values shown as white circles while the maximum temperature corresponds to the maximum value among values shown as black circles.

For example, in a case where the temperature of the center portion C is greater than the temperature of brine by 20° C.-30° C., the temperature of the heater 75a at the center portion C is controlled to be greater than the temperature of the brine by 20° C. Also, the heaters 75b, 75c and 75d at the middle portion M, the edge portion E and the very edge portion VE are controlled to be greater than the temperature of the brine by 20° C.-40° C.

Further, in a case where the temperature of the center portion C is greater than the temperature of brine by 30° C.-40° C., the temperature of the heater 75a at the center portion C is controlled to be greater than the temperature of the brine by 30° C. Also, the heater 75b at the middle portion M is controlled to be greater than the temperature of the brine by 30° C.-50° C. Further, the heater 75c at the edge portion E is controlled to be greater than the temperature of the brine by 30° C.-55° C. Also, the heater 75d at the very edge portion VE is controlled to be greater than the temperature of the brine by 30° C.-60° C.

However, when the high frequency powers HF and LF are applied, the heat input from the plasma to the mounting table 12 occurs, and the output values of the heaters 75 decrease. Therefore, the temperature difference between the brine and the heaters 75 may decrease to cause the temperature control of the heaters 75 to be unstable. In contrast, in the temperature control of the present embodiment, the temperatures of the heaters 75 are controlled according to the heat input amount from the plasma, thereby securing the stability of the temperature control of the heaters 75 and the brine.

Figure 5:
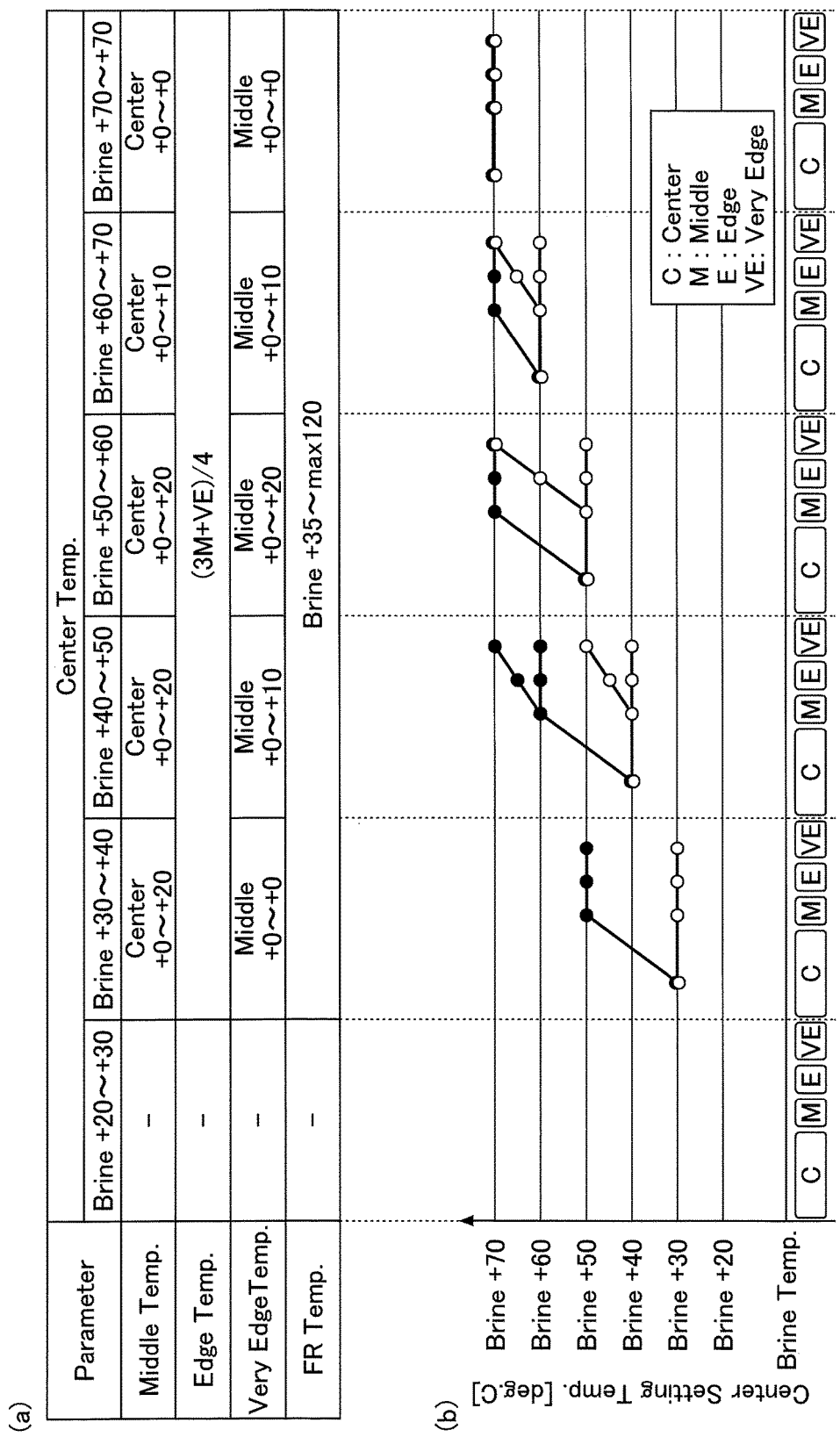
FIG. 5 is a diagram illustrating another example temperature control according to the heat input amount.

An example temperature control method of the present embodiment for controlling the temperature of the heaters 75 in a case where the total power of the high frequency powers HF and LF is 1000 W will be described with reference to FIG. 5. FIG. 5 shows an example operation map for the temperature control of the center portion C, the middle portion M, the edge portion E, the very edge portion VE and the focus ring 18 with respect to the brine in a case where the total power of the high frequency powers HF and LF is 1000 W. Portion (b) of FIG. 5 shows example operation map illustrating the temperature control range of the heaters 75 at the center portion C, the middle portion M, the edge portion E and the very edge portion VE according to the temperature differences between the brine and the heaters 75 shown in the portion (a) of FIG. 5.

In a case where the total power of high frequency powers HF and LF is 1000 W, the control unit 50 calculates the temperature of heat input to the heaters 75a, 75b, 75c and 75d in the mounting table 12 due to the heat input amount from the plasma to be 10° C. based on formula "$y_2=0.0097x_2$", as shown in FIG. 2.

Consequently, as shown in FIG. 5, the control unit 50 controls the temperature difference between the respective heaters at the center portion C to the very edge portion VE and the brine by adding 10° C. to the temperature difference of FIG. 4 when neither of the high frequency powers HF and LF is applied. That is, the operation map of FIG. 5 is generated, where temperature bands shown in FIG. 4, which indicate respective temperature differences between the heater 75a at the center portion (Center Temp.) and the brine at 10° C. intervals, are shifted in right by one temperature band. Thus, the control unit 50 can control the temperatures of respective heaters 75 by adding 10° C. to the temperature difference in a case where neither of the high frequency powers HF and LF is not applied by using the operation map of FIG. 5. Consequently, the temperature differences are set taking account of the heat input amount from the plasma, thereby preventing instability of the temperature control of the heaters 75 and the brine.

Figure 6:
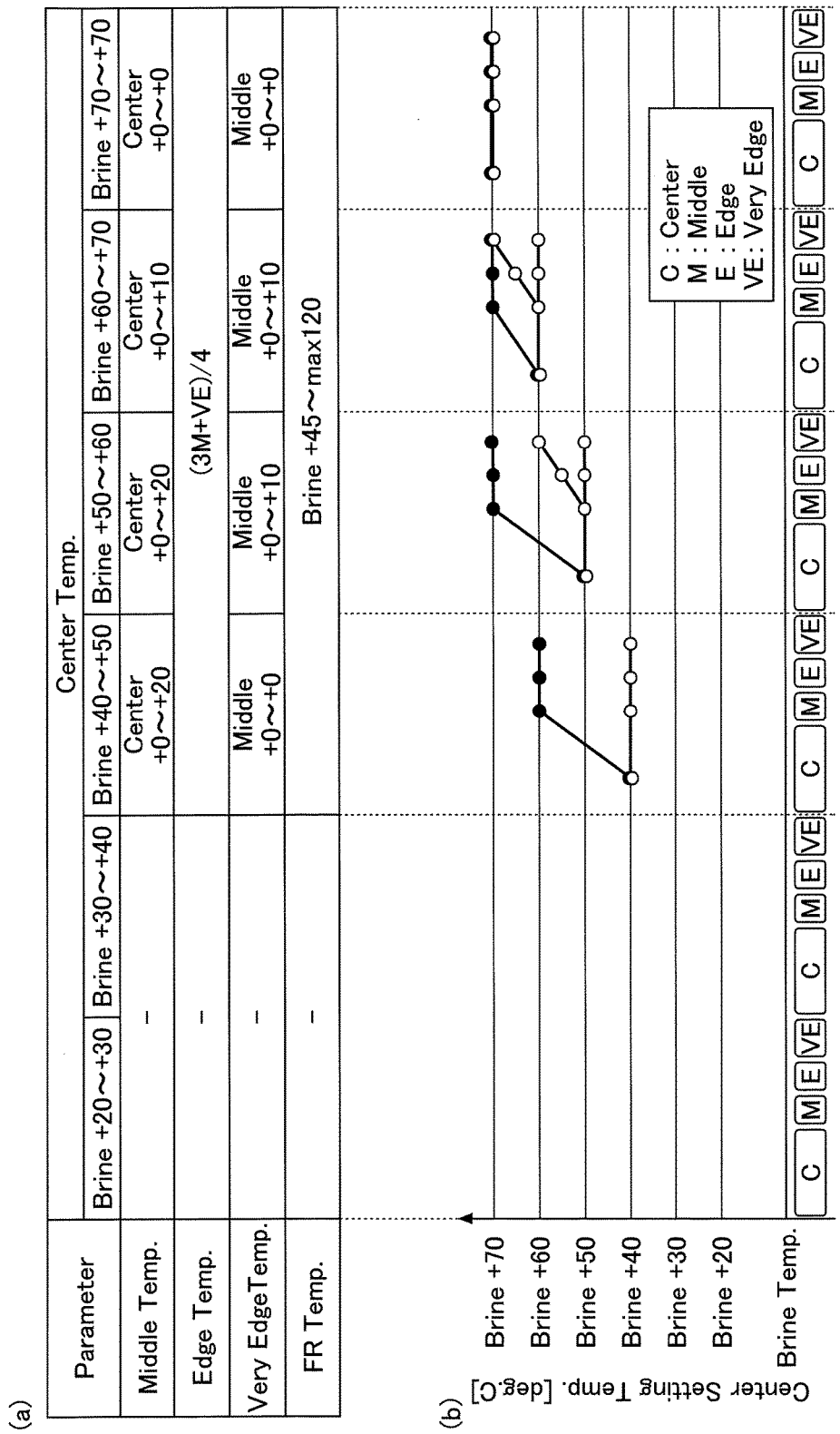
FIG. 6 is a diagram illustrating another example temperature control according to the heat input amount.

Similarly, an example operation map for controlling the temperatures of center portion C to very edge portion VE with respect to the brine in a case where the total power of the high frequency powers HF and LF is 2000 W is shown in FIG. 6. Through the calculation based on a graph shown in FIG. 2, the control unit 50 controls the temperature difference between the respective heaters 75 and the brine by adding 20° C. to the temperature difference of FIG. 4 when neither of the high frequency powers HF and LF are not applied. In this case, the control unit 50 generates an operation map shown in FIG. 6, where temperature bands set at 10° C. intervals shown in FIG. 4 are shifted in right by two temperature bands. Then, the control unit 50 controls the temperatures of the respective heaters 75 based on the temperatures set in the operation map of FIG. 6.

Figure 7:
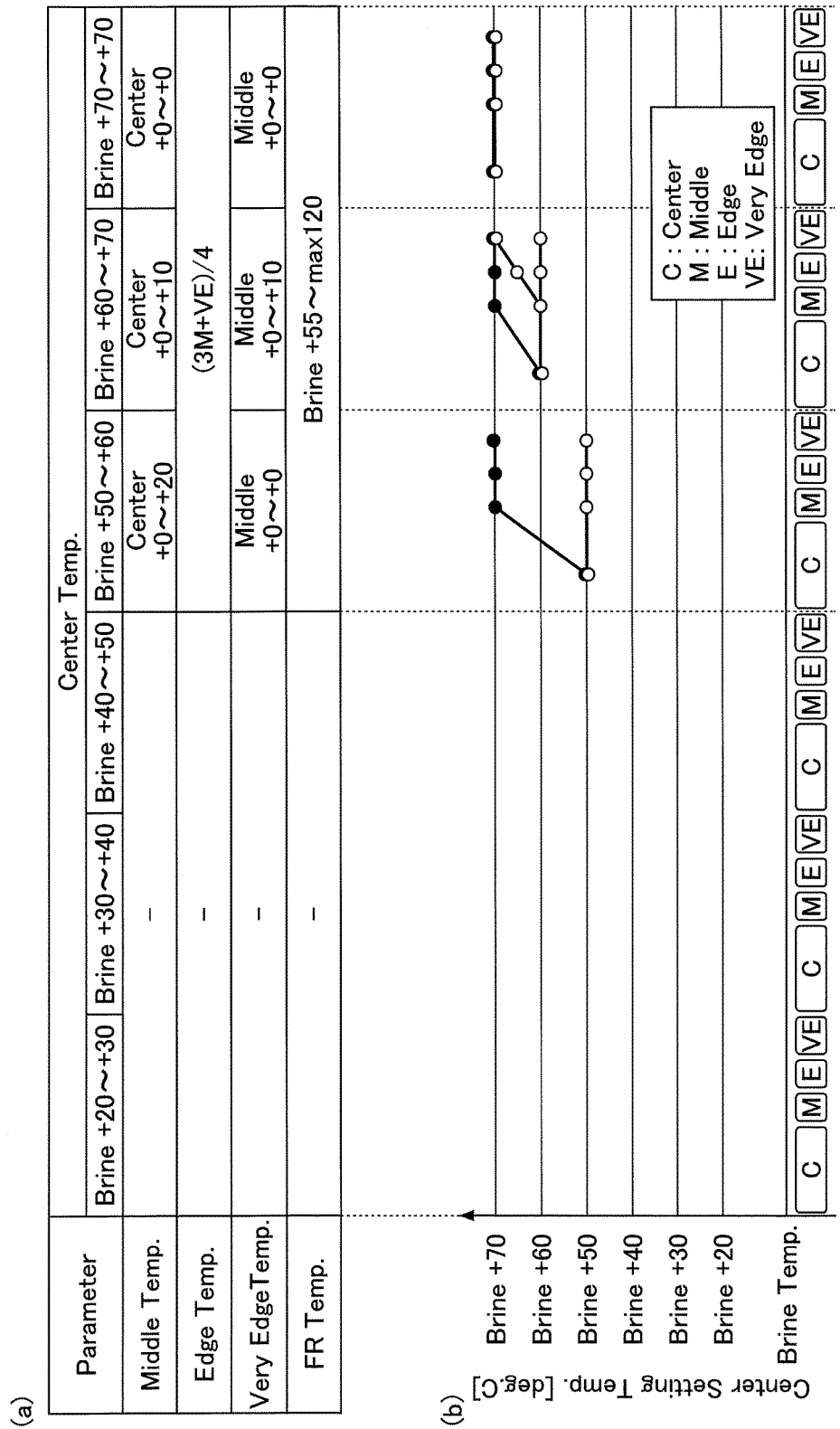
FIG. 7 is a diagram illustrating another example temperature control according to the heat input amount.

Similarly, an example operation map for controlling the temperatures of center portion C to very edge portion VE with respect to the brine in a case where the total power of the high frequency powers HF and LF is 3000 W is shown in FIG. 7. Through the calculation based on a graph shown in FIG. 2, the control unit 50 controls the temperature difference between the respective heaters 75 and the brine by adding 30° C. to the temperature difference of FIG. 4 when neither of the high frequency powers HF and LF are not applied. In this case, the control unit 50 generates an operation map shown in FIG. 7, where temperature bands set at 10° C. intervals shown in FIG. 4 are shifted in right by three temperature bands. Then, the control unit 50 controls the temperatures of the respective heaters 75 based on the temperatures set in the operation map of FIG. 7.

Figure 8:
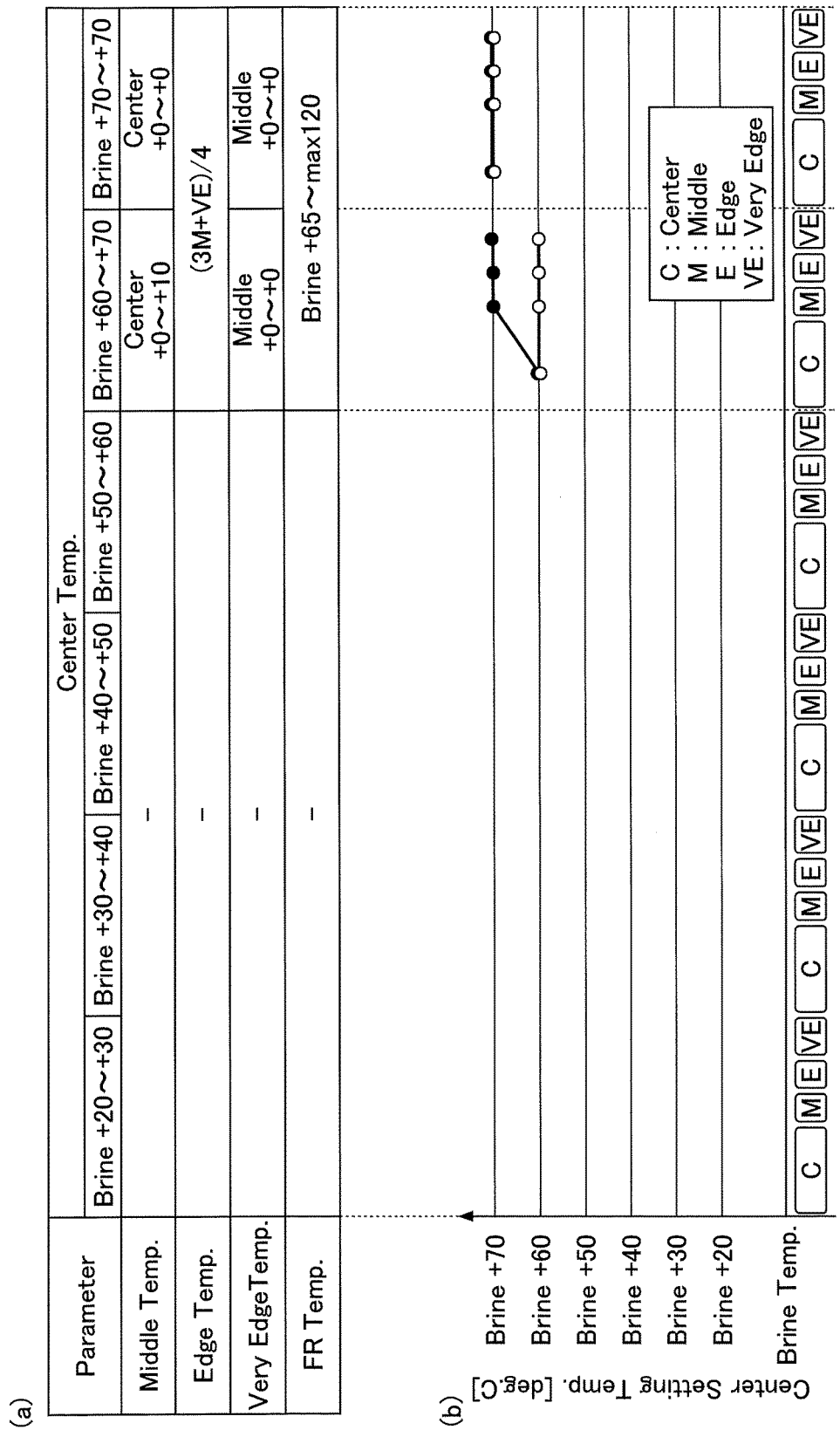
FIG. 8 is a diagram illustrating another example temperature control according to the heat input amount.

Similarly, an example operation map for controlling the temperatures of the center portion C to the very edge portion VE with respect to the brine in a case where the total power of the high frequency powers HF and LF is 4000 W is shown in FIG. 8. Through the calculation based on a graph shown in FIG. 2, the control unit 50 controls the temperature difference between the respective heaters 75 and the brine by adding 40° C. to the temperature difference of FIG. 4 when neither of the high frequency powers HF and LF is applied. In this case, the control unit generates an operation map shown in FIG. 8, where temperature bands set on a 10° C.-by-10° C. basis shown in FIG. 4 are shifted in right by four temperature bands. Then, the control unit 50 controls the temperatures of the respective heaters 75 based on the temperatures set in the operation map of FIG. 8.

Consequently, the temperatures of the respective heaters 75 can be controlled so that the temperature differences between the brine and the heaters 75 are set by adding the temperature corresponding to the heat input amount from the plasma to the temperature differences when neither of the high frequency powers HF and LF is applied. Therefore, instability of the temperature control due to small temperature differences between the heaters 75 and the brine can be prevented.

Additionally, when the temperature control is performed in accordance with the operation maps of FIG. 5-FIG. 8, the control unit 50 controls, similarly to a case of FIG. 4, the temperature differences between the heaters 75a-75d at the center portion C-the very edge portion VE and the brine to be equal to or less than 70° C. Also, the control unit 50 controls the respective temperature difference between the heater 75a at the center portion and the heater 75d at the very edge portion to be equal to or less than 30° C.

Further, in the present embodiment, the control unit 50 calculates the heat input amount to the focus ring 18 according to the total power of the high frequency powers HF and LF based on formula "$y_1=0.0112x_1$" shown in FIG. 2. The control unit 50 may control the temperature of the focus ring 18 so that the temperature of the focus ring 18 is greater than or equal to a value found by adding the calculated temperature to the temperature of the brine where the maximum temperature is 120° C.

In step S16 of FIG. 3, the control unit 50 calculates a second heat input amount to the focus ring 18 according to the total power of the high frequency power HF and LF based on formula "$y_1=0.0112x_1$" shown in FIG. 2.

Additionally, according to the operation maps of FIG. 5-FIG. 8, in a case where the total power of the high frequency powers HF and LF is 1000 W, the control unit 50 controls the temperature of the focus ring 18 so that the temperature of the focus ring 18 is greater than or equal to a value found by adding 35° C. to the temperature of the brine where the maximum temperature is 120° C. (FIG. 5). In a case where the total power of the high frequency powers HF and LF is 2000 W, the control unit 50 controls the temperature of the focus ring 18 so that the temperature of the focus ring 18 is greater than or equal to a value found by adding 45° C. to the temperature of the brine where the maximum temperature is 120° C. (FIG. 6). In a case where the total power of the high frequency powers HF and LF is 3000 W, the control unit 50 controls the temperature of the focus ring 18 so that the temperature of the focus ring 18 is greater than or equal to a value found by adding 55° C. to the temperature of the brine where the maximum temperature is 120° C. (FIG. 7). In a case where the total power of the high frequency powers HF and LF is 4000 W, the control unit 50 controls the temperature of the focus ring 18 so that the temperature of the focus ring 18 is greater than or equal to a value found by adding 65° C. to the temperature of the brine where the maximum temperature is 120° C. (FIG. 8).

Then, the control unit 50 controls the temperature of the heater 75d so that the temperature difference between the brine and the heater 75d at the focus ring 18 is to be a value corresponding to the second heat input amount (step S18). Then, the process is terminated.

In a case where the high frequency powers HF and LF are applied, the output of the heaters 75 decreases due to the heat input amount from the plasma, which causes instability of the temperature control of the heaters 75 at areas where the temperature differences between the brine and the heaters 75 is low. Conventionally, the temperature of the heaters 75 needs to be controlled separately from the temperature of the brine in order to make the temperature control stable. However, such a control is complex. In contrast, in the present embodiment, the data table indicating relationship between the high frequency power and the heat input amount is created in advance, and the temperature control range of the heaters 75 according to the heat input amount from the plasma can be estimated. Thus, the stability of the temperature control of the heaters 75 and the brine can be secured.

In the embodiment described above, the temperatures of the heaters 75 are controlled to secure a predetermined temperature differences between the heaters 75 and the brine. However, the control unit 50 may control the temperature of the brine instead of the heaters 75, or may control the temperature of both the heater 75 and the brine. That is, by controlling the temperature of at least any of the heaters 75 and the brine, the temperature difference between the heaters 75 and the brine can be kept from being too low, thereby securing the stability of the temperature control of the heater 75 and the brine taking account of the heat input amount from the plasma.

In a case where the temperature of the brine is controlled, an example temperature control method is preformed, in which a high temperature brine layer and a low temperature brine layer are formed in the chiller unit 71, and the respective layers are switched to perform high speed temperature control of the brine.

In the embodiment described above, the operation map is generated with reference to the temperature difference between the center portion C and the brine. However, the operation map may be generated with reference to the temperature difference between any of the middle portion M and the brine, the edge portion E and the brine, and the very edge portion VE and the brine. Also, the operation map can be automatically generated based on the relational expressions indicating the relationship between the high frequency power and the heat input amount.

<Another Example Graph Indicating Relationship Between High Frequency Power and Heat Input Amount>

Figure 9:
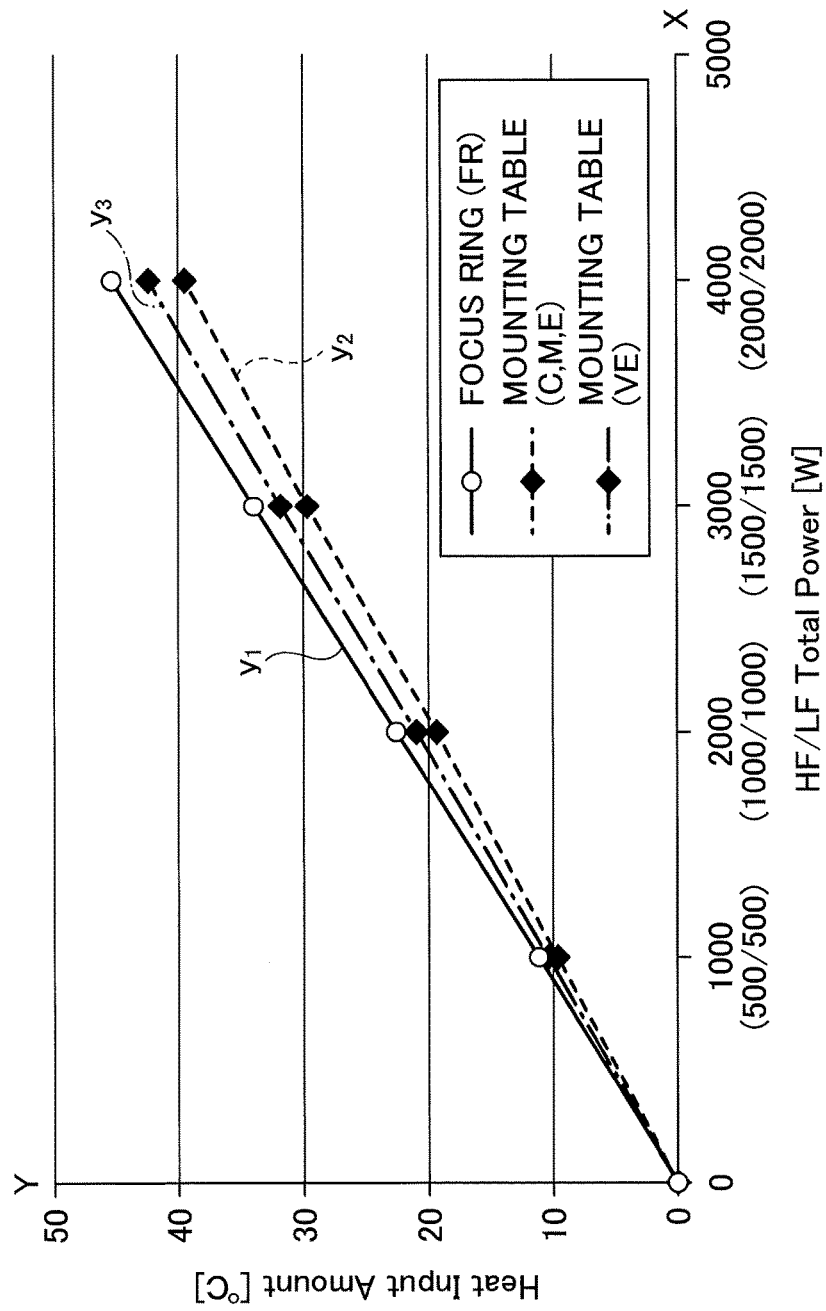
FIG. 9 is another example graph indicating the relationship between the high frequency power and the heat input amount.

In the following, another example graph indicating the relationship between the high frequency power and the heat input amount will be described. FIG. 9 is another example graph indicating the relationship between the total power of the high frequency powers HF and LF and the heat input amount from the plasma. FIG. 2 shows the relationship between the total power of the high frequency powers HF and LF and the heat input amount based on the relational expression $y_2$, assuming that the same amount of heat is input to the center portion C-very edge portion VE in the mounting table 12. In contrast, FIG. 9 shows the relationship between the total power of the high frequency powers HF and LF and the heat input amount based on the relational expression $y_2$, assuming that the same amount of heat is input to the center portion C-edge portion E in the mounting table 12. In FIG. 9, the relationship between the total power of the high frequency powers HF and LF and the heat input amount at the very edge portion VE is found based on the relational expression $y_3$. Thus, the temperature control of the heaters 75 can be performed more precisely, taking into account that the heat input amount from the plasma may be greater at the very edge portion VE than at the center portion C-edge portion E depending on positions of the coolant pipe 70 of the brine.

In the embodiment described above, the temperature of the heaters 75 are controlled based on the change of the heat input amount from the plasma due to the application of the high frequency powers HF and LF, while other factors for changing the heat input amount are not considered. However, the temperature control of the heaters 75 and the brine may be performed taking account of not only the high frequency power but also heat input amount from objects other than plasma, such as hot gas. In this case, a data table indicating the relationship between the hot gas, etc., and the heat input amount is generated in advance, and the temperature control range of the heaters 75 according to the heat input amount from the object other than plasma can be estimated based on the relational expression in the data table. When the temperature control according to the heat input amount from the object other than plasma is used in combination with the temperature control range according to the heat input amount from the plasma, more improved stability of the temperature control of the heaters 75 and the brine can be secured. Additionally, the brine and the heaters 75 form an example temperature adjusting mechanism provided in the plasma processing apparatus.

Herein above, although the temperature control method of the mounting table and the plasma processing apparatus have been described with respect to a above described embodiment for a complete and clear disclosure, the temperature control method of the mounting table and the plasma processing apparatus of the present invention are not to be thus limited but are to be construed as embodying all modifications and alternative constructions within the scope of the present invention. Also, the above described embodiments and a modification or alternative construction may be combined without including inconsistency.

For example in the temperature control method described in the embodiments, in addition to the temperatures of the heaters and the brine, the temperatures of the gas shower head 38 and an inner wall or a deposition shield of the chamber 10 may be controlled based on the relational expression indicating the relationship between the high frequency power or the amount of the hot gas and the heat input amount calculated in advance.

Also, the temperature control method for controlling the temperature of the mounting table described in the embodiments can be applied to not only Capacitively Coupled Plasma (CCP) processing apparatuses but also to other various types of plasma processing apparatuses. Such plasma processing apparatuses include an Inductively Coupled Plasma (ICP) processing apparatus, a Helicon Wave Plasma (HWP) processing apparatus, a plasma processing apparatus using a radial line slot antenna, an Electron Cyclotron Resonance Plasma (ECR) processing apparatus, and the like.

Although, in the above described embodiment, the etching process is performed on the semiconductor wafer W, this is not a limiting example. For example, the etching process may be performed on a substrate used for a LCD (Liquid Crystal Display) or a FPD (Flat Panel Display), a photo mask, a CD substrate, a printed substrate, and the like.

Herein above, although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A temperature control method for controlling temperature of a mounting table in a plasma processing apparatus for mounting a substrate thereon, wherein a temperature adjusting mechanism is disposed in the plasma processing apparatus, the temperature adjusting mechanism including a cooling mechanism for cooling the mounting table and a first heating mechanism for heating the mounting table, the temperature control method comprising:

calculating a first heat input amount according to high frequency power applied in a given process, wherein the first heat input amount is calculated based on a data table stored in a storage unit in advance, the data table being generated by measuring temperatures so as to find a first relationship between the high frequency power applied in the plasma processing apparatus and the heat input amount to the mounting table;

controlling, based on an operation map stored in the storage unit, temperature of at least one of the first heating mechanism and the cooling mechanism so that a first temperature difference between the cooling mechanism and the first heating mechanism is within a controllable range corresponding to the first heat input amount, wherein the temperature of the first heating mechanism is controllable upon the first temperature difference falling within the controllable range, and the operation map defines a series of successive control ranges associated with respective different first heat input amounts.

2. The temperature control method according to claim 1, wherein the first heating mechanism is able to heat the mounting table on a zone-by-zone basis, a surface of the mounting table divided into a plurality of zones, the operation map in which the controllable range of the first temperature difference is defined is stored in the storage unit, the staged controllable ranges corresponding to first heat input amounts being set on a zone-by-zone basis, and at least any of temperatures of the first heating mechanism corresponding to the respective zones and the temperature of the cooling mechanism are controlled based on the operation map so that temperature differences of the respective zones fall within the controllable range corresponding to the first heat input amount.

3. The temperature control method according to claim 1, wherein the temperature adjusting mechanism includes a second heating mechanism for heating a focus ring surrounding an outer edge of the mounting table, the storage unit stores a data table generated by measuring temperatures so as to find a second relationship between the high frequency power applied in the plasma processing apparatus and the heat input amount to the focus ring;

a second heat input amount according to high frequency power applied in the given process is calculated based on the data table, and temperature of at least one of the second heating mechanism and the cooling mechanism is controlled based on the operation map so that a second temperature difference between the cooling mechanism and the second heating mechanism falls within a controllable range corresponding to the second heat input amount, wherein a temperature of the second heating mechanism is controllable upon the second temperature difference falling within the controllable range.

4. The temperature control method according to claim 1, wherein at least any of temperatures of the first heating mechanism and the cooling mechanism are controlled so that the temperature difference between the first heating mechanism and the cooling mechanism is equal to or less than 70° C.

5. The temperature control method according to claim 2, wherein the temperatures of the first heating mechanism corresponding to the respective zones are controlled so that a temperature difference between a outermost zone and innermost zone is equal to or less than 30° C.

6. The temperature control method according to claim 2, wherein the first heating mechanism heats the surface of the mounting table on a zone-by-zone basis, the surface of the mounting table being divided, from center to outer edge, into four zones of a center zone, a middle zone, an edge zone and a very edge zone, and the temperature of the first heating mechanism corresponding to the edge zone is controlled so that the temperature of the edge zone is expressed by $$E=(3\times M+VE)/4,$$

wherein E, M and VE respectively indicate temperatures of the edge zone, the middle zone and the very edge zone.

7. The temperature control method according to claim 3, wherein at least any of temperatures of the second heating mechanism and the cooling mechanism are controlled based on the operation map so that a minimum value of the temperature difference between the cooling mechanism and the second heating mechanism is included in the controllable range according to the second heat input amount while the maximum value of the temperature difference is equal to or less than 120° C.

8. A plasma processing apparatus including a control unit for controlling temperature of a mounting table for mounting a substrate thereon, the plasma processing apparatus comprising a temperature adjusting mechanism including a cooling mechanism for cooling the mounting table and a first heating mechanism for heating the mounting table, wherein the control unit performs a process comprising:

calculating a first heat input amount according to high frequency power applied in a given process, wherein the first heat input amount is calculated based on a data table stored in a storage unit in advance, the data table being generated by measuring temperatures so as to find a first relationship between the high frequency power applied in the plasma processing apparatus and the heat input amount to the mounting table;

controlling, based on an operation map stored in the storage unit, temperature of at least one of the first heating mechanism and the cooling mechanism so that a first temperature difference between the cooling mechanism and the first heating mechanism is within a controllable range corresponding to the first heat input amount, wherein the temperature of the first heating mechanism is controllable upon the first temperature difference falling within the controllable range, and the operation map defines a series of successive control ranges associated with respective different first heat input amounts.

* * * * *